United States Patent [19]

Shaw

[11] 4,248,683
[45] Feb. 3, 1981

[54] LOCALIZED ANODIC THINNING

[75] Inventor: Don W. Shaw, Dallas, Tex.

[73] Assignee: The United States of America as represented by the Secretary of the Navy, Washington, D.C.

[21] Appl. No.: 142,794

[22] Filed: Apr. 22, 1980

[51] Int. Cl.³ .............................. C25F 3/12; C25F 3/14
[52] U.S. Cl. ............................... 204/129.3; 204/129.65
[58] Field of Search ................ 204/129.3, 129.65, 279

[56] References Cited

U.S. PATENT DOCUMENTS

| 3,418,226 | 12/1968 | Marinace | 204/129.65 |
| 3,669,858 | 6/1972 | LaBoda | 204/129.65 |
| 3,678,348 | 7/1972 | Reber | 317/235 |
| 3,890,215 | 6/1975 | DiLorenzo | 204/129.2 |
| 3,964,156 | 6/1976 | Williams | 29/579 |
| 4,096,619 | 6/1978 | Cook, Jr. | 29/413 |

Primary Examiner—T. M. Tufariello
Attorney, Agent, or Firm—R. S. Sciascia; Sol Sheinbein

[57] ABSTRACT

A protective mask and a method of localized anodic thinning to prevent excessive thinning of an epitaxial layer in the forming of a field effect transistor. A moat exposing the epitaxial layer is provided in the protective mask surrounding a device pattern or group of patterns to be formed in the epitaxial layer by anodic thinning. During the thinning process, the area of the epitaxial layer exposed by the moat becomes fully depleted and cuts off current into the region surrounded by the moat and prevents excessive thinning of the epitaxial layer under the design pattern.

14 Claims, 8 Drawing Figures

LOCALIZED ANODIC THINNING

BACKGROUND OF THE INVENTION

The present invention relates to anodic thinning of an epitaxial layer in the forming of a semiconductor such as a field effect transistor, and more particularly to a protective mask and method of using the mask to prevent excessive thinning of the epitaxial layer.

Anodic thinning is an effective procedure for reducing the active layer thickness of epitaxial structures to the optimum values required for device or circuit fabrication. While the basic procedure is self limiting, it is capable of significantly improving the uniformity of nonuniform surface structures and has been applied to gross thinning of entire epitaxial wafers prior to device fabrication.

The gross anodic thinning of semiconductor devices is disclosed in U.S. Pat. No. 3,890,215, to DiLorenzo et al. An epitaxial layer on a semi-insulating substrate designed for use in a field effect transistor is subjected to successive electrolytic oxidations and dissolution of the oxide by a dilute acid until the depletion region resulting from the applied potential extends into the semi-insulating region whereupon oxide growth and anodic thinning stops. The thinning process is self-limiting at a desired thickness dependent on the potential applied, the semi-conductor, the doping level of the epitaxial layers, and the electrolyte.

When the DiLorenzo et al method is applied to localized thinning, as opposed to gross thinning, the process is no longer self limiting and continues beyond the desired optimum value resulting in a channel thickness unsuitable for device fabrication.

SUMMARY OF THE INVENTION

Accordingly, in the present invention there is provided a protective mask and a method of localized anodic thinning for preventing excessive thinning of an epitaxial layer in the forming of a field effect transistor.

A single layer or multilayer epitaxial structure is grown on a semi-insulating substrate. The topmost layer is coated with $Si_3N_4$ as a protective mask. Device patterns with surrounding moats are formed in the protective mask to expose the underlying topmost epitaxial layer. The structure is then subjected to anodic thinning to etch the exposed epitaxial layer to the desired depth. When the epitaxial area exposed by the moats is thinned to the desired depth, current is pinched off to the region surrounded by the moat thus preventing excessive thinning of the epitaxial layer exposed by the device pattern.

OBJECTS OF THE INVENTION

It is therefore an object of the present invention to provide a method for anodic thinning of an epitaxial layer on semi-insulating substrates.

Another object is to provide a method for localized anodic thinning of one or more epitaxial layers grown on semi-insulating substrates.

Still another object is to provide a method for localized anodic thinning of one or more epitaxial layers on a semi-insulating substrate which prevents excessive thinning of the layers.

Yet another object is to provide a protective mask for localized anodic thinning of an epitaxial layer on a semi-insulating substrate.

A still further object is to provide a protective mask for localized anodic thinning of an epitaxial layer on a semi-insulating substrate which prevents excessive thinning of the layer.

Other objects, advantages and novel features of the present invention will become apparent from the following detailed description of the invention when considered in conjunction with the drawings.

BRIEF DESCRIPTION OF THE DRAWINGS

A more complete appreciation of the invention and many of the attendant advantages thereof will be readily understood by reference to the following detailed description when considered with the accompanying drawings in which like numerals designate like parts throughout the figures and wherein.

DESCRIPTION OF THE PREFERRED EMBODIMENTS

Gross anodic thinning is an effective procedure for reducing the active layer thickness of epitaxial structures to nearly the optimum values for field effect transistors. The basic process is self-limiting and theoretically should be transferable to localized anodic thinning for complex multilayer structures. For example, the gate stripes and channel region between the source and drain contacts of a field effect transistor could be selectively thinned to leave material outside the gate stripes and channel to form the contacts.

In attempting to apply anodic thinning to a localized area of small dimensions it was discovered that the anodic thinning process was no longer self limiting but instead proceeded beyond the optimum value and resulted in channels unsuitable for device fabrication.

Figure 1:
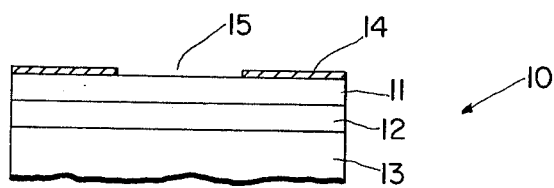
FIG. 1 shows a cross-section of the semiconductor and protective mask.

Referring to FIG. 1 there is shown a three epitaxial layer structure 10 which is to be thinned to form a field effect transistor. The epitaxial layers are formed of GaAs, grown on semi-insulating substrates, or similar materials such as GaP, AlGaAs, InGaP, AlGaP, InGaAs, InSb, InAs, InGaAsP, GaAsP and mixtures thereof. Although FIG. 1 illustrates a three layer structure, it is to be understood that the invention is applicable to a structure having one or more epitaxial layers.

As shown in FIG. 1, the epitaxial layers are formed with a topmost n+ contact layer 11 followed by an active layer 12 and an innermost, undoped, high resistivity buffer layer 13. The layers are grown by a vapor phase epitaxy process on a Cr-doped, semi-insulating substrate (not shown). The n+ contact layer is coated by plasma deposition with an $Si_3N_4$ layer 14. It is contemplated that layer 14 could also be $SiO_2$ or any polymerized photoresist material. Device pattern 15 is formed in layer 14 by chemical etching or other process and is shown as an opening in the Si$_3$N$_4$ layer. The Si$_3$N$_4$ layer serves as a mask to protect the epitaxial layers from gross thinning and device pattern 15 exposes only the area of the epitaxial layers desired to be locally thinned.

The GaAs layers exposed by pattern 15 are subjected to successive cycles of electrolytic anodization with subsequent removal of the resulting oxide by dissolution either in the electrolyte or in a separate dissolution process. Each anodization/dissolution cycle removes a well defined amount of GaAs. The structure is thinned to etch entirely through n+ layer 11 and partially through active layer 12.

Figure 8:
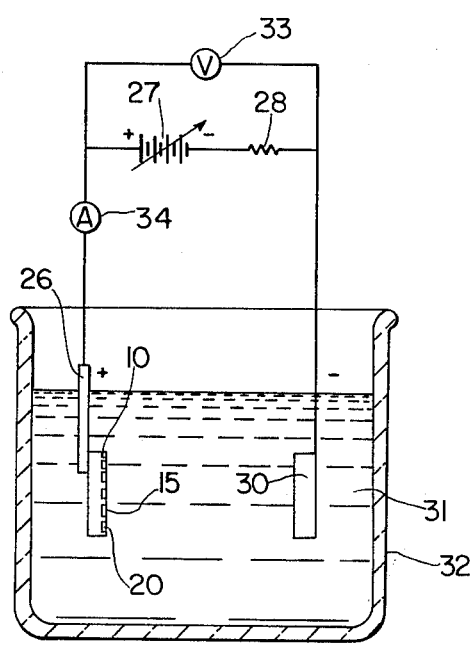
FIG. 8 shows a schematic illustration of an anodic thinning system for use with the present invention.

During anodization, structure 10 is reverse biased by attachment to anode 26 with a platinum wire 30 as the cathode, see FIG. 8. The anodizations are performed in container 32 with an 80 volt potential battery 27, a current limiting resistor 28 and an electrolyte 31 such as 0.02 Mole NaH$_2$PO$_4$. The structure is anodized until the cell current drops to negligible values and the oxide thickness, as indicated by its color, ceases to change. After each anodization the resulting oxide is dissolved either in the electrolyte or in an acid such as dilute HCL. A voltmeter 33 and an ammeter 34 are included in the circuit for monitoring the voltage and the current.

Figure 2:
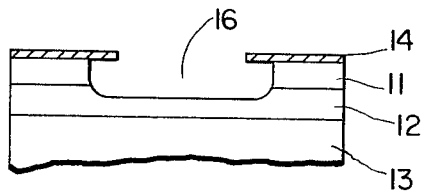
FIG. 2 shows a theoretical cross-section of the semiconductor after anodic thinning.
Figure 3:
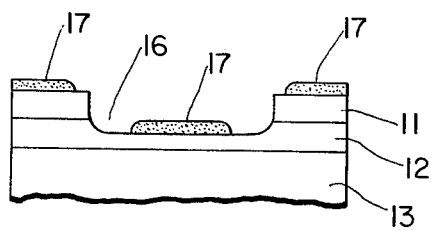
FIG. 3 shows a cross-section of the semiconductor with the contacts applied.

Theoretically, the anodization process should be self-limiting in thinning active layer 12 to form a uniform channel 16, as shown in FIG. 2, for mounting of contacts 17, as shown in FIG. 3. For appreciable current flow and anodization, structure 10 is biased sufficiently to cause avalanche breakdown with a corresponding depletion region extending into the active layer. As the active layer is anodically thinned, the depletion depth at avalanche breakdown eventually reaches buffer layer 13 or the semi-insulating substrate (not shown) where current flow ceases and anodization can no longer occur. The self-limiting thickness, which occurs when the depletion layer at breakdown reaches the substrate, is near the optimum value required for field effect transistors. The exact thickness is a function of the doping level of the layers.

Figure 4:
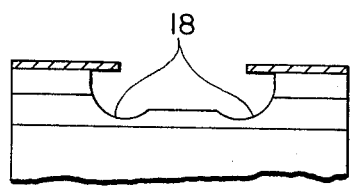
FIG. 4 shows an actual cross-section of the semiconductor with excessive anodic thinning.
Figure 5:
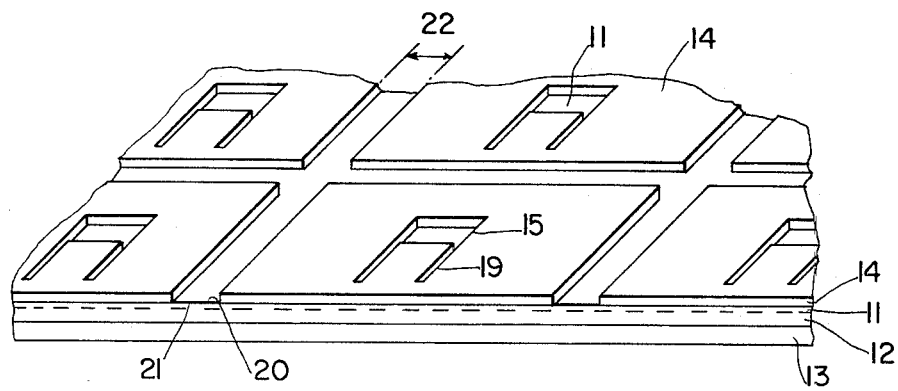
FIG. 5 shows an isometric view of the semiconductor and protective mask before anodic thinning.
Figure 6:
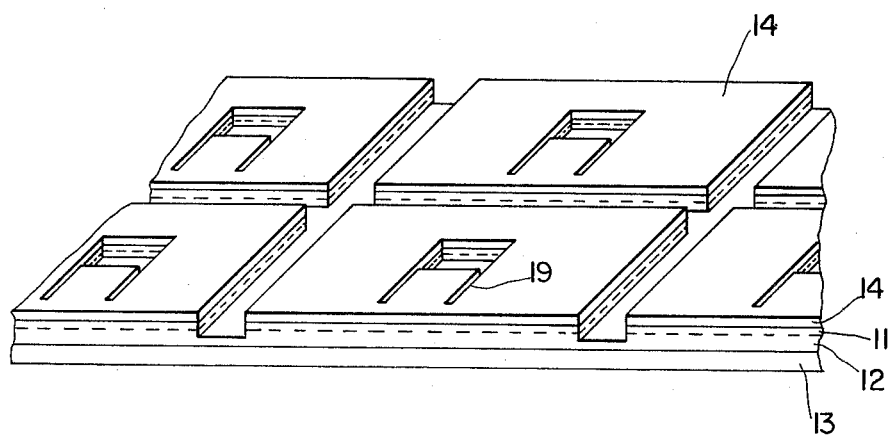
FIG. 6 shows an isometric view of the semiconductor and protective mask after anodic thinning.

In practice, when the anodic thinning process is applied locally to areas of small dimension it was found that excessive etching, beyond the desired depth, would take place around the perimeter of device pattern 15 in mask 14, as illustrated by shallow grooves 18 in FIG. 4, or in narrow channels in the mask such as gate stripes 19, illustrated in FIGS. 5 and 6. Oxide continued to form in these regions during the anodization process resulting in a reduction of the active layer beyond the optimum value. Apparently, localized, anodic thinning is not self-limiting if a region of conductive material is in close proximity to the region being thinned. Thus, within thin gate stripes 19 and around the perimeter of device pattern 15 there is an adequate thickness of unthinned, conductive material to the side of the area to be thinned, beneath Si$_3$N$_4$ layer 14, for avalanche breakdown and anodization to occur even though the depletion region has reached the buffer layer in the region to be thinned.

The problem of excessive etching may be circumvented by surrounding each device pattern 15, or group of patterns, with a moat 20 in Si$_3$N$_4$ layer 14 which exposes uppermost n+ layer 11, as shown in FIG. 5. The moats isolate the device patterns such that when the structure is anodized central portions 21 of the moats anodize, become fully depleted, and pinch off current into the regions surrounded by the moats. Thus all anodic thinning in the center regions, containing device patterns 15, ceases when the surrounding moats become depleted, as shown in FIG. 6. More importantly, the excessive etching is prevented thereby providing uniform gate stripes and channels for the mounting of the contacts. The moats must be of a sufficient width 22 (approximately 15 μm or greater) to allow their central portions 21 to anodize to the self-limiting thickness in the usual manner and electrically isolate the center regions containing device patterns 15. The actual width of the moat is determined by the electrical characteristics of the epitaxial layers.

Figure 7:
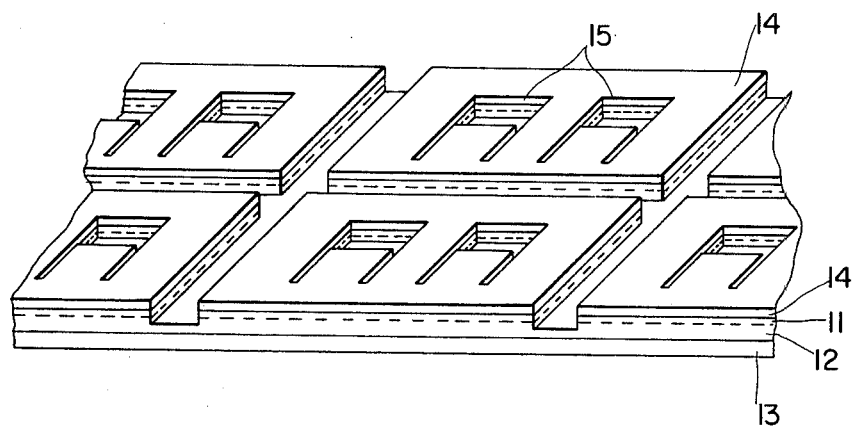
FIG. 7 shows an isometric view of the semiconductor with a moat surrounding more than one device pattern.

Although FIGS. 5 through 7 illustrate two rows of device patterns 15 with each device surrounded by a rectangular moat, it is contemplated that more than two rows may be positioned in the Si$_3$N$_4$ layer 14 such that the inner rows of patterns are completely surrounded by moats 20. It is also contemplated that a moat can surround more than one design pattern, as shown, in FIG. 7, and can be of any shape sufficient to terminate current flow to the design pattern.

It is apparent that the disclosed method of thinning and protective mask provide for localized anodic thinning of epitaxial layers on semi-insulating substrates without excessive thinning of the layers beyond the desired depth.

Obviously, many modifications and embodiments of the specific invention other than those set forth above, will readily come to mind to one skilled in the art having the benefit of the teachings presented in the foregoing description and the accompanying drawings of the subject invention and hence it is to be understood that the invention is not limited thereto and that such modifications are intended to be included within the scope of the appended claims.

What is claimed is:

1. A method for thinning to a desired depth one or more epitaxial layers of a semiconductor structure in selected areas, comprising the steps of:
   providing a protective layer over said one or more layers;
   forming design patterns in the protective layer to expose the selected areas;
   forming moat means in the protective layer surrounding the design patterns;
   subjecting the structure to repeated anodizations in an electrolyte to form an oxide in the one or more epitaxial layers; and
   removing the oxide.

2. The method according to claim 1 further comprising the step of:
   repeating the anodizations until the desired depth is reached.

3. The method according to claim 1 wherein the protective layer is formed by plasma deposition.

4. The method according to claim 1 wherein the anodizations are self-limiting at the desired depth without excessive thinning beyond the desired depth.

5. The method according to claim 1 wherein the dissolution of the oxide takes place in the electrolyte.

6. The method according to claim 1 wherein the dissolution of the oxide is done by an acid.

7. The method according to claim 1 wherein the protective layer is selected from the group consisting of Si$_3$N$_4$, SiO$_2$ and polymerized photoresistants.

8. The method according to claim 1 wherein the semiconductor structure is selected from the group consisting of GaAs, GaP, AlGaAs, InGaAs, InSb, InGaP, AlGaP, InGaAsP, GaAsP and InAs.

9. A protective mask for localized anodic thinning by current flow of one or more epitaxial layers of a semiconductor structure in selected areas, comprising:
   a layer of protective material covering the one or more epitaxial layers;
   design patterns formed in the protective layer to expose selected areas; and
   means terminating current flow to the selected areas exposed by the design patterns;
   whereby when the semiconductor structure is subjected to anodization of the one or more epitaxial layers, said means terminating current flow to the selected areas prevents excessive thinning of the selected areas.

10. The protective mask according to claim 9 wherein the means terminating current flow to the selected areas is formed in the protective layer to expose the one or more epitaxial layers.

11. The protective mask according to claim 10 wherein the means terminating current flow to the selected areas are moat means surrounding the design patterns so as to expose the one or more epitaxial layers.

12. The protective mask according to claim 11 wherein the moat means separate the design patterns.

13. The protective mask according to claim 9 wherein the protective layer is selected from the group consisting of $Si_3N_4$, $SiO_2$ and polymerized photoresistants.

14. The protective mask according to claim 9 wherein the semiconductor structure is selected from the group consisting of GaAs, GaP, AlGaAs, InGaP, AlGaP, InGaAs, InSb, InGaAsP, GaAsP and InAs.

* * * * *